(12) United States Patent  
Naem

(10) Patent No.: US 6,479,382 B1
(45) Date of Patent: Nov. 12, 2002

(54) DUAL-SIDED SEMICONDUCTOR CHIP AND METHOD FOR FORMING THE CHIP WITH A CONDUCTIVE PATH THROUGH THE CHIP THAT CONNECTS ELEMENTS ON EACH SIDE OF THE CHIP

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/802,148

(22) Filed: Mar. 8, 2001

(51) Int. Cl.$^7$ .......................... H01L 21/44; H01L 21/84
(52) U.S. Cl. ................... 438/658; 438/660; 438/667; 438/928
(58) Field of Search ................... 438/268, 689, 438/696, 927, 975, 618, 667, 658, 928, 660, 718; 257/510, 526, 621, 622, 734, 774

(56) References Cited

U.S. PATENT DOCUMENTS

| | | | |
|---|---|---|---|
| 3,928,093 A | 12/1975 | van Tongerloo et al. | 148/186 |
| 3,937,579 A | 2/1976 | Schmidt | 356/144 |
| 4,189,820 A | 2/1980 | Slack | 29/425 |
| 4,261,781 A | 4/1981 | Edmonds et al. | 156/254 |
| 4,782,028 A | 11/1988 | Farrier et al. | 437/3 |
| 5,142,756 A | 9/1992 | Ibaraki et al. | 29/25.01 |
| 5,166,097 A * | 11/1992 | Tanielian | 437/203 |
| 5,240,882 A | 8/1993 | Satoh et al. | 437/226 |
| 5,250,460 A | 10/1993 | Yamagata et al. | 437/62 |
| 5,362,683 A | 11/1994 | Takenaka et al. | 437/226 |
| 5,530,552 A | 6/1996 | Mermagen et al. | 356/401 |
| 5,608,237 A | 3/1997 | Aizawa et al. | 257/132 |
| 5,739,067 A | 4/1998 | Debusk | 438/618 |
| 6,010,951 A | 1/2000 | Pushpala et al. | 438/458 |
| 6,110,825 A * | 8/2000 | Mastromatteo et al. | 438/53 |
| 6,187,677 B1 * | 2/2001 | Ahn | 438/660 |
| 6,221,769 B1 * | 4/2001 | Dhong et al. | 438/667 |

FOREIGN PATENT DOCUMENTS

JP        6419729       1/1989     H01L/21/304

* cited by examiner

Primary Examiner—Michael S. Lebentritt
(74) Attorney, Agent, or Firm—Mark C. Pickering

(57) ABSTRACT

A dual-sided semiconductor chip is formed on a wafer to have a low-resistance, electrically-conductive path through the wafer. By forming the conductive path through the wafer, elements on one side of the wafer can exchange signals (voltages and/or currents) with elements on the other side of the wafer.

5 Claims, 4 Drawing Sheets

DUAL-SIDED SEMICONDUCTOR CHIP AND METHOD FOR FORMING THE CHIP WITH A CONDUCTIVE PATH THROUGH THE CHIP THAT CONNECTS ELEMENTS ON EACH SIDE OF THE CHIP

BACKGROUND OF THE INVENTION

1. Field of the Invention

The present invention relates to a dual-sided semiconductor chip and a method for forming the chip and, more particularly, to a dual-sided semiconductor chip and a method for forming the chip with a conductive path through the chip that connects elements on each side of the chip.

2. Description of the Related Art

A dual-sided semiconductor chip is a chip that has electrical circuits on both sides of a wafer. Thus, unlike more conventional semiconductor chips that utilize only one side of a wafer, a dual-sided chip utilizes both sides of the wafer. As a result, packaged dual-sided semiconductor chips consume significantly less circuit-board real estate than conventional single-sided chips.

FIG. 1 shows a cross-sectional drawing that illustrates a dual-sided semiconductor chip 100. As shown in FIG. 1, chip 100 includes a wafer 110 that has a top side 112 and a bottom side 114. As further shown in FIG. 1, chip 100 also includes an electrical circuit 120 which is formed on top side 112, and an electrical circuit 122 which is formed on bottom side 114. Electrical circuits 120 and 122 typically communicate with the outside world via wires that are connected to pads that form a part of circuits 120 and 122.

Circuits 120 and 122 can perform related or unrelated functions. When related functions are performed, circuits 120 and 122 can exchange signals via a wire that is connected to a pad that forms a part of circuit 120 and a pad that forms a part of circuit 122. Although this approach allows circuits 120 and 122 to exchange signals, there is a need for alternate techniques of exchanging signals.

SUMMARY OF THE INVENTION

The present invention provides a technique for exchanging signals on a dual-sided semiconductor chip by forming a low-resistance, conductive path through the wafer that allows elements on one side of the wafer to exchange signals (voltages and/or currents) with certain elements on the other side of the wafer.

The method of the present invention forms a dual-sided semiconductor chip from a wafer that has a top surface and a bottom surface. The method includes the step of forming a first opening in the wafer. The first opening extends through the wafer from the top surface to the bottom surface, and has side-wall surfaces.

The method also includes the step of forming a layer of insulation material on the side-wall surfaces. The method further includes the step of forming a layer of conductive material to contact the layer of insulation material and fillup the first opening.

The present invention also includes a dual-sided semiconductor device that is formed on a wafer that has a top surface and a bottom surface. The device includes an opening that is formed in the wafer. The opening extends through the wafer from the top surface to the bottom surface, and has side-wall surfaces. The device also includes a layer of insulation material that is formed on the side-wall surfaces. The device further includes a column of conductive material that is formed to contact the layer of insulation material and fill up the opening. The column has a top surface and a bottom surface.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 2A–8A are plan views, and FIGS. 2B–8B are cross-sectional views taken along lines 2B–8B, respectively, in FIGS. 2A–8A, respectively.

FIG. 9A is a plan view, and FIG. 9B is a cross-sectional view taken along line 9B in FIG. 9A.

DETAILED DESCRIPTION

FIGS. 2A–2B through 8A–8B are drawings that illustrate a method of forming a dual-sided semiconductor chip in accordance with the present invention. As described in greater detail below, the method of the present invention forms a low-resistance, conductive path through a wafer that allows elements on one side of the wafer to exchange signals (voltages and/or currents) with elements on the other side of the wafer.

The method of the present invention utilizes a conventionally-prepared wafer 200 that has a polished top surface 210, a polished bottom surface 212, and side-wall surfaces 214. Wafer 200 can be formed from a number of semiconductor materials such as, for example, silicon, germanium, gallium arsenide, aluminum-gallium arsenide, or indium phosphine. In addition, wafer 200 is doped to have either an n-type or p-type conductivity.

Figure 1:
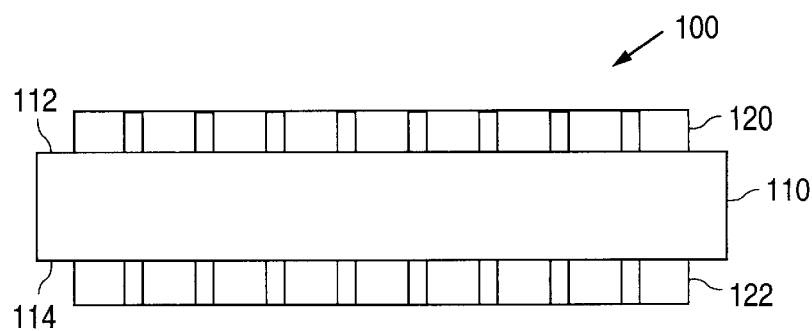
FIG. 1 is a cross-sectional drawing that illustrates a dual-sided semiconductor chip 100.
Figures 2A, 3A:
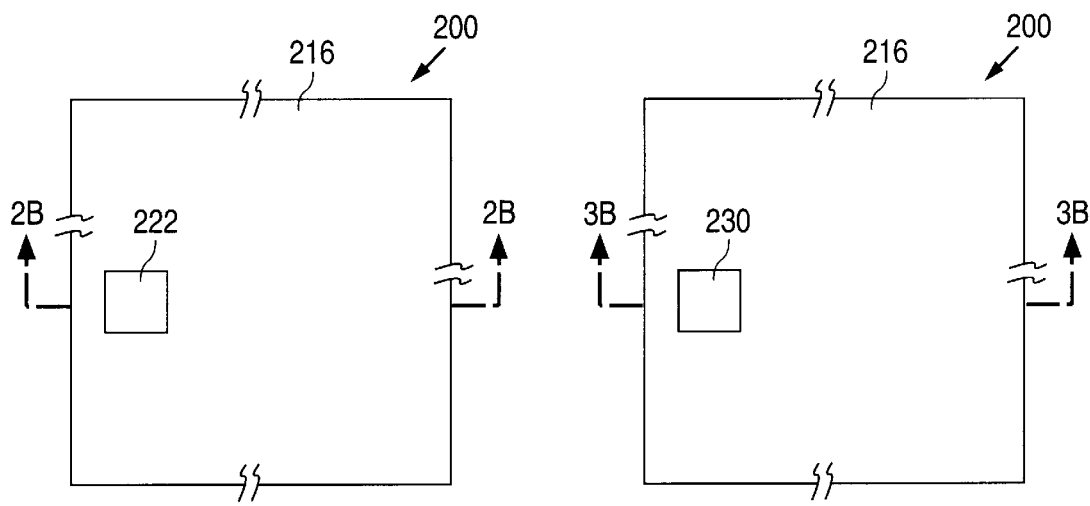
FIGS. 2A–2B through 8A–8B are drawings illustrating a method of forming a dual-sided semiconductor chip in accordance with the present invention.
Figures 2B, 3B:
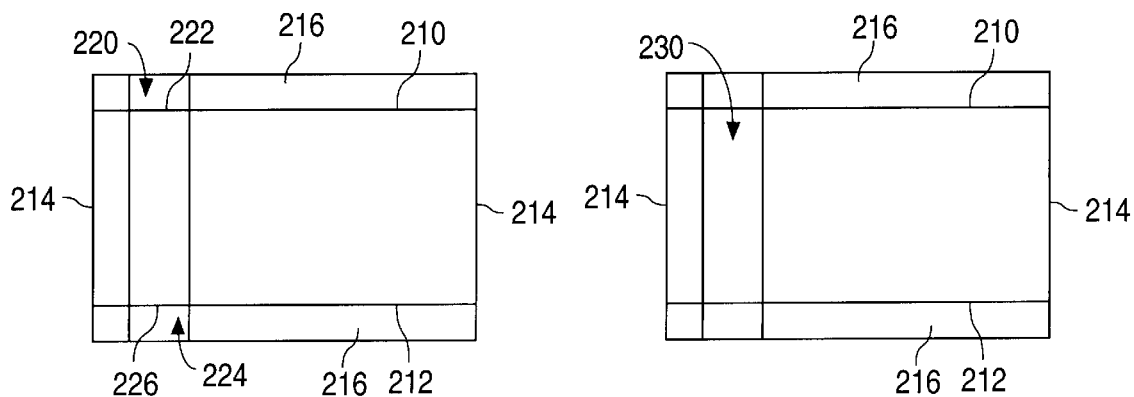

As shown in FIGS. 2A–2B, the method begins with the formation of a layer of masking material 216 on top surface 210 and bottom surface 212. Masking layer 216 is then patterned to form an opening 220 that exposes a region 222 of top surface 210, and an opening 224 that exposes a region 226 of bottom surface 212. Masking layer 216 can be formed as a hard mask from, for example, a layer of oxide, a layer of nitride, or a combination of layers.

Openings 220 and 224 are aligned with each other such that the left and right sides of opening 220 are substantially in register with the left and right sides of opening 224, respectively. Conventional techniques for the alignment of reticles or masks can be used to align openings 220 and 224 such as, for example, the techniques disclosed in U.S. Pat. No. 3,939,579 to Schmidt and U.S. Pat. No. 5,530,552 to Mermagen et al. which are hereby incorporated by reference.

As shown in FIGS. 3A–3B, following the formation of openings 220 and 224, exposed region 222 on top surface 210 and exposed region 226 on bottom surface 212 are anisotropically etched until an opening 230 is formed through wafer 200. Following this, masking layer 216 is removed.

Alternately, rather than forming masking layer 216 on both sides of wafer 200, masking layer 216 can be formed on only one side, such as top side 210, of wafer 200. Once formed, masking layer 216 is patterned to form an opening, such as opening 220. Next, wafer 200 is anisotropically etched to form opening 230. By masking only one side of wafer 200, mask alignment issues are eliminated.

Figure 4A:
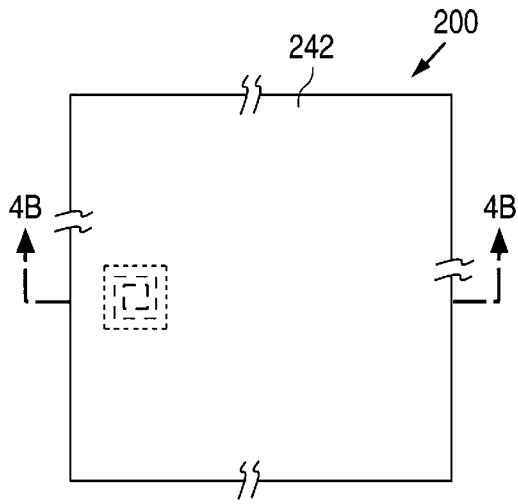
Figure 4B:
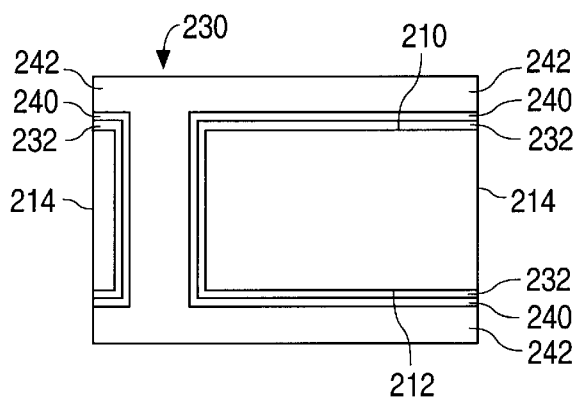

As shown in FIGS. 4A–4B, after opening 230 has been formed, a layer of oxide 232 is formed on the exposed surfaces of opening 230, and on the top and bottom surfaces 210 and 212. Next, a diffusion barrier layer 240 is formed on oxide layer 232. Following this, a layer of conductive material 242 such as, for example, aluminum, tungsten, copper, or coped polysilicon, is formed on diffusion barrier layer 240 to fill up opening 230. Diffusion barrier layer 240 and conductive layer 242 can be formed using conventional deposition techniques such as, for example, chemical vapor deposition (CVD) techniques. Alternately, the formation of diffusion barrier layer 240 can be omitted so that conductive layer 242 is formed to be in direct contact with oxide layer 232.

Figure 5A:
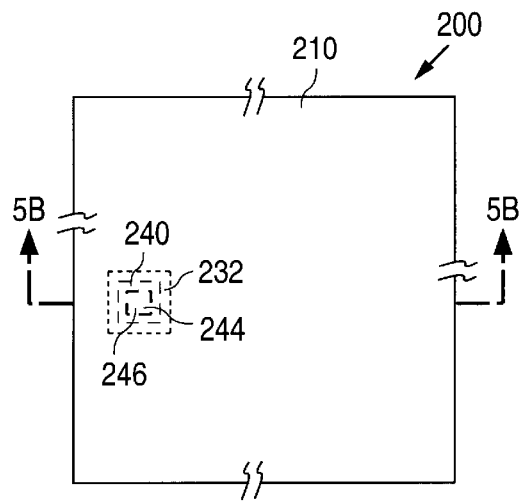
Figure 5B:
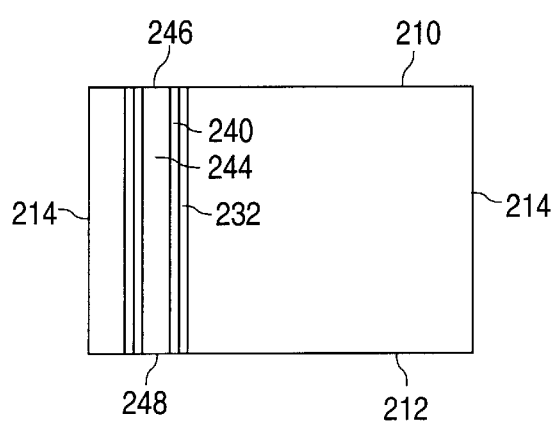

Next, as shown in FIGS. 5A–5B, wafer 200 is planarized to remove the regions of conductive layer 242, diffusion barrier layer 240, and oxide layer 232 that lie above top surface 210 and below bottom surface 212. The planarization forms a conductive column 244 with an exposed top surface 246 that is substantially planar with top surface 210, and an exposed bottom surface 248 that is substantially planar with bottom surface 212.

Figure 6A:
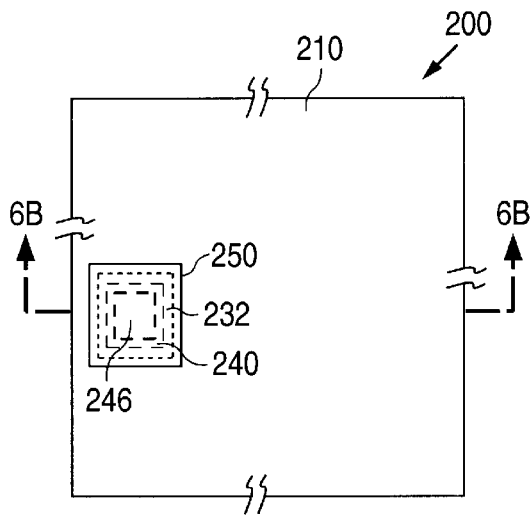
Figure 6B:
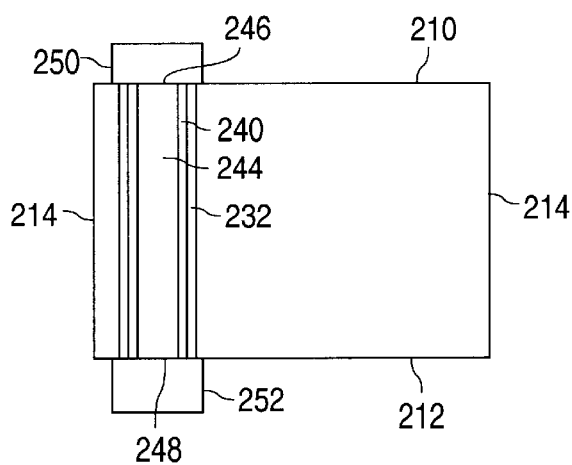

Following this, as shown in FIGS. 6A–6B, a top-side electrical circuit that includes a top-side element 250 is formed on top side 210, and a bottom-side electrical circuit that includes a bottom-side element 252 is formed on bottom-side 212 using conventional steps. (In addition to the Schmidt and Mermagen references, U.S. Pat. No. 6,010,951 to Pushpala et al., U.S. Pat. No. 3,928,093 to van Tongerloo et al., and U.S. Pat. No. 4,782,028 to Farrier et al., which are each hereby incorporated by reference, are directed towards dual-sided semiconductor processing.)

During processing, a protective material may need to be applied one or more times to top side 210 during the fabrication of portions of bottom side 212, and/or to bottom side 212 during the fabrication of portions of top side 210, to protect one side during the fabrication of the circuit on the other side. Elements 250 and 252, which need not be the same, can include contacts and other structures, such as transistors, resistors, and capacitors.

In accordance with a first embodiment of the present invention, as shown in FIGS. 6A–6B, top-side element 250 is formed to be directly connected to exposed surface 246 of conductive column 244, and bottom-side element 252 is formed to be directly connected to exposed surface 248 of conductive column 244.

Figure 7A:
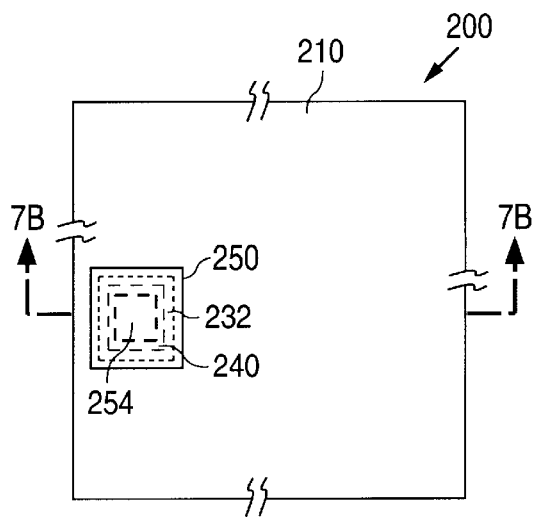
Figure 7B:
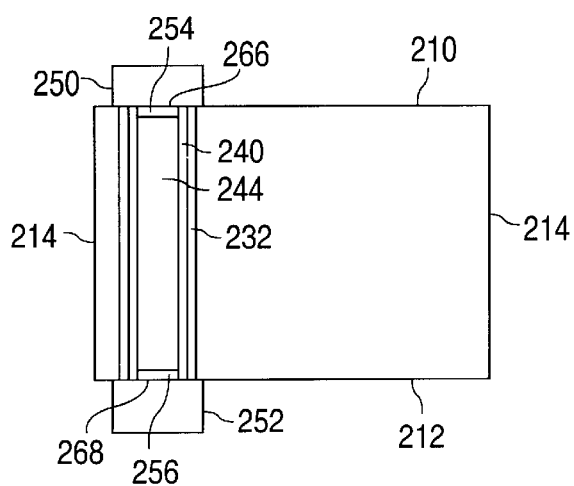

In a second embodiment of the present invention, as shown in FIGS. 7A–7B, top-side element 250 is formed to be connected to conductive column 244 via a diffusion barrier region 254, and bottom-side element 252 is formed to be connected to conductive column 244 via a diffusion barrier region 256. As a result, conductive column 244 is surrounded by a diffusion barrier.

Figure 8A:
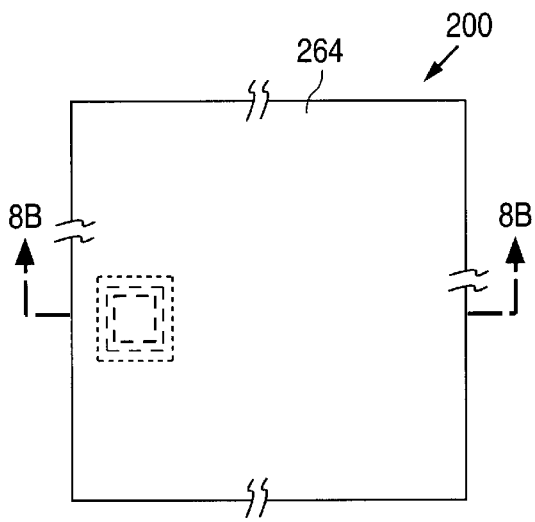
Figure 8B:
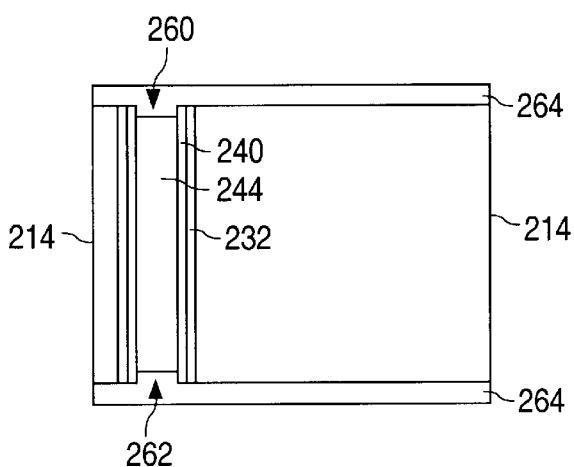

For example, as shown in FIGS. 8A–8B, after the planarization step shown in FIGS. 5A–5B, exposed surfaces 246 and 248 can be etched to form an opening 260 and an opening 262 in conductive column 244. Following this, a diffusion barrier layer 264 can be formed to fill up openings 260 and 262. After this, diffusion barrier layer 264 can be planarized to form diffusion barrier regions 254 and 256 of FIGS. 7A–7B. As a result, a top surface 266 of diffusion barrier region 254 is substantially planar with top surface 210, and a bottom surface 268 of diffusion barrier region 256 is substantially planar with bottom surface 212.

In addition, in a third embodiment of the present invention, top-side element 250 is formed to be connected to conductive column 244 via diffusion barrier region 254, and bottom-side element 252 is formed to be directly connected to exposed surface 248.

To insure that top-side element 250 and bottom-side element 252 are positioned over and below, respectively, conductive column 244, the masks used to form elements 250 and 252, as well as any related structures, may need to be aligned. As noted above, conventional techniques such as the techniques disclosed in Schmidt and Mermagen et al. can be utilized to achieve the needed alignment.

Once top and bottom side elements 250 and 252 have been formed, the process continues with conventional back-end processing steps to form a dual-sided semiconductor chip. (As is well known, wafers are conventionally cut to form a number of dice which each include the same circuitry. Thus, in the present invention, a conductive column is formed through the wafer region of each die. Each die is then packaged to form a chip. In addition, due to the need to handle and support wafer 200 during processing, as well as the conventional shape of a wafer, not all of the surface area is typically available to produce a die.)

Thus, the present method forms a dual-sided semiconductor chip with a low-resistance, conductive path through a wafer. By forming the chip with a conductive path through the wafer, desired elements on both sides of the wafer can exchange signals (voltages and/or currents) with each other.

Figure 9A:
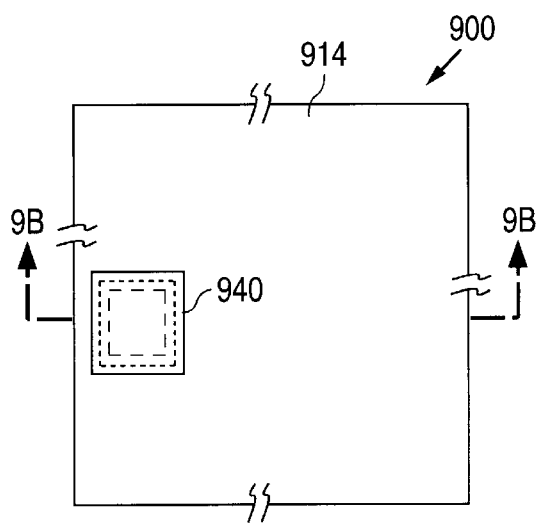
FIGS. 9A–9B are drawings illustrating a dual-sided semiconductor chip 900 in accordance with the present invention.
Figure 9B:
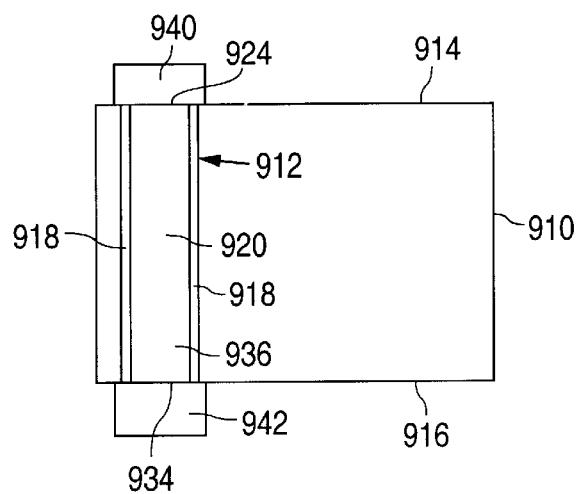

FIGS. 9A–9B show drawings that illustrate a dual-sided semiconductor chip 900 in accordance with the present invention. As shown in FIGS. 9A–9B, chip 900 has a wafer 910 with an opening 912 formed through wafer 910 that extends from a top surface 914 to a bottom surface 916 of wafer 912. In addition, device 900 has a layer of oxide 918 formed on the exposed surfaces of opening 912, and a conductive region 920 that is formed on oxide layer 918 in opening 912. Oxide layer 918 electrically isolates conductive region 920 from wafer 910.

Region 920, which has a top surface 924 and a bottom surface 934, can be formed from a conductive material, or a conductive material and a diffusion barrier material that partly or completely surrounds the conductive material as noted above. Conductive region 920 forms a column 936 through wafer 910 that electrically connects top surface 914 of wafer 910 with bottom surface 916 of wafer 910.

As additionally shown in FIGS. 9A–9B, chip 900 includes a first element 940 that is formed to contact top surface 924 of conductive region 920 (the conductive material or the diffusion barrier material). Chip 900 also includes a second element 942 that is formed to contact bottom surface 934 of conductive region 920 (the conductive material or the diffusion barrier material). Elements 940 and 942, which may or may not be the same, can be, for example, portions of transistors, resistors, capacitors, or contacts.

In operation, when no current flows through column 936, a voltage on top surface 924 of conductive region 920 has a value that is substantially equal to a voltage on bottom surface 934 of conductive region 920. When a current flows through column 936, a voltage on top surface 924 of conductive region 920 has a value that differs from a voltage on bottom surface 934 of conductive region 920 by a difference value. The difference value, in turn, is equal to a magnitude of the current times a resistance of column 936.

It should be understood that various alternatives to the embodiment of the invention described herein may be employed in practicing the invention. For example, although the invention has been described in terms of forming a single conductive path through the wafer, a number of conductive paths can also be formed through the wafer. (A number of conductive paths can be formed through the wafer region associated with each die.)

In addition, although the invention has been described in terms of forming the conductive path prior to the formation of the top-side and bottom-side electrical circuits, the method of the present invention can be integrated into the fabrication process of the top and bottom-side electrical circuits. For example, buried layers, wells, and epitaxial layers can be formed on top and bottom sides 210 and 212 prior to beginning the method of the present invention. Thus, it is intended that the following claims define the scope of the invention and that methods and structures within the scope of these claims and their equivalents be covered thereby.

What is claimed is:

1. A method of forming dual-sided semiconductor chip from a wafer, the wafer having a top surface and a bottom surface, the method comprising the steps of:

forming a first opening in the wafer, the first opening extending through the wafer from the top surface to the bottom surface and having side-wall surfaces;

forming an insulation layer on the side-wall surfaces;

forming a diffusion barrier layer on the layer of insulation;

forming a layer of conductive material to contact the diffusion barrier layer and fill up the first opening through the wafer, the layer of conductive material having a top end;

removing a portion of the layer of conductive material from the top end to form a top opening; and forming a diffusion barrier region in the top opening.

2. A method of forming a dual-sided semiconductor chip from a wafer, the wafer having a top surface and a bottom surface, the method comprising the steps of:

forming a first opening in the wafer, the first opening extending through the wafer from the top surface to the bottom surface and having side-wall surfaces;

forming an insulation layer on the side-wall surfaces;

forming a diffusion barrier layer on the layer of insulation;

forming a layer of conductive material to contact the diffusion barrier layer and fill up the first opening through the wafer;

removing a portion of the layer of conductive material to form a top opening, and a portion of the layer of conductive material to form a bottom opening; and forming a first diffusion barrier region in the top opening, and the second diffusion barrier region in the bottom opening, the diffusion barrier layer, the first diffusion region, and the second diffusion region surrounding the layer of conductive material.

3. The method of claim 2 and further comprising the step of forming a first element over the wafer and a second element below the wafer, the first element contacting the first diffusion region, the second element contacting the second diffusion region.

4. The method of claim 2 and further comprising the step of planarizing the layer of conductive material to form a top surface that is substantially planar with the top surface of the wafer, and a bottom surface that is substantially planar with the bottom surface of the wafer.

5. The method of claim 1 wherein a surface of the diffusion barrier region and the top surface are substantially planar.

* * * * *